United States Patent
Yoshikawa et al.

(10) Patent No.: US 7,333,789 B2
(45) Date of Patent: *Feb. 19, 2008

(54) WIDE-BAND MODULATION PLL, TIMING ERROR CORRECTION SYSTEM OF WIDE-BAND MODULATION PLL, MODULATION TIMING ERROR CORRECTION METHOD AND METHOD FOR ADJUSTING RADIO COMMUNICATION APPARATUS HAVING WIDE-BAND MODULATION PLL

(75) Inventors: Hiroyuki Yoshikawa, Machida (JP); Shunsuke Hirano, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 381 days.

This patent is subject to a terminal disclaimer.

(21) Appl. No.: 10/529,539

(22) PCT Filed: Aug. 4, 2004

(86) PCT No.: PCT/JP2004/011506

§ 371 (c)(1),
(2), (4) Date: Mar. 29, 2005

(87) PCT Pub. No.: WO2005/025052

PCT Pub. Date: Mar. 17, 2005

(65) Prior Publication Data

US 2006/0052073 A1  Mar. 9, 2006

(30) Foreign Application Priority Data

Aug. 22, 2003  (JP) ............................. 2003-298856

(51) Int. Cl.
*H04B 1/18*  (2006.01)
(52) U.S. Cl. .............................. 455/180.3; 455/183.1; 455/255; 455/260; 375/294; 375/327

(58) Field of Classification Search ............. 455/180.3, 455/180.4–184.1, 424, 425, 456.5, 258, 465.1, 455/456.6, 42, 550.1, 575.1, 561, 67.11, 63.1, 455/114.2, 205, 278.1, 318, 208, 165.1, 255, 455/265, 260, 147; 332/128, 118, 119, 127, 332/123, 108, 117, 144, 151, 160, 120; 375/376, 375/302, 294, 327, 344, 362; 331/1 R, 16, 331/23, 17, 25

See application file for complete search history.

(56) References Cited

U.S. PATENT DOCUMENTS 4,447,792 A * 5/1984 Wynn ........................ 332/128

(Continued)

FOREIGN PATENT DOCUMENTS

EP  0 408 238 A2  1/1991

(Continued)

*Primary Examiner*—Edward F. Urban
*Assistant Examiner*—Charles Chow
(74) *Attorney, Agent, or Firm*—Pearne & Gordon LLP

(57) ABSTRACT

A broadband modulation PLL includes a PLL portion containing a voltage controlled oscillator (101), a frequency divider (105), a phase comparator (104) and a loop filter (103). A frequency-dividing ratio of the frequency divider (105) is controlled to apply modulation, and also an input voltage of the voltage controlled oscillator (101) is controlled to apply modulation. One of phase modulation data for controlling the frequency dividing ratio and phase modulation data for input voltage of the voltage controlled oscillator (101) is inverted in phase by using an inverter (113), and the delay control circuit (110) detects a timing error on the basis of a signal (133) achieved by adding the output signals (131) and (132) of the filter (106) and the loop filter (103), and the timing is controlled by the delay circuits (111) and (112) to correct, the timing error.

16 Claims, 8 Drawing Sheets

U.S. PATENT DOCUMENTS

| | | | |
|---|---|---|---|
| 4,611,230 A * | 9/1986 | Nienaber | 348/511 |
| 4,755,774 A * | 7/1988 | Heck | 332/123 |
| 4,810,977 A * | 3/1989 | Flugstad et al. | 332/127 |
| 5,166,642 A * | 11/1992 | Hietala | 331/1 A |
| 5,207,491 A | 5/1993 | Rottinghaus | |
| 5,557,244 A * | 9/1996 | Salvi | 332/128 |
| 5,903,194 A * | 5/1999 | Opsahl et al. | 331/1 A |
| 5,983,077 A * | 11/1999 | Dent | 455/44 |
| 6,141,394 A * | 10/2000 | Linebarger et al. | 375/376 |
| 6,160,456 A * | 12/2000 | Chang | 331/25 |
| 6,211,747 B1 * | 4/2001 | Trichet et al. | 332/128 |
| 6,515,553 B1 * | 2/2003 | Filiol et al. | 332/127 |
| 7,046,972 B2 * | 5/2006 | Matsuyoshi et al. | 455/114.3 |
| 7,061,341 B1 * | 6/2006 | Groe | 332/103 |
| 7,157,985 B2 * | 1/2007 | Mitani et al. | 332/119 |
| 2001/0036240 A1 * | 11/2001 | Gossmann et al. | 375/376 |
| 2002/0105389 A1 * | 8/2002 | Nishimura et al. | 331/100 |
| 2004/0036539 A1 * | 2/2004 | Hammes et al. | 331/16 |
| 2004/0192231 A1 * | 9/2004 | Grewing et al. | 455/102 |
| 2005/0046488 A1 * | 3/2005 | Grewing et al. | 331/23 |
| 2005/0232385 A1 * | 10/2005 | Yoshikawa et al. | 375/376 |
| 2006/0202774 A1 * | 9/2006 | Hirano | 332/144 |

FOREIGN PATENT DOCUMENTS

| | | |
|---|---|---|
| GB | 0408238 A2 * | 3/1991 |
| JP | 1-282908 | 11/1989 |
| JP | 7-30332 | 1/1995 |
| JP | 11-4201 | 1/1999 |
| JP | 11-503888 | 3/1999 |
| WO | 02/067428 A2 | 8/2002 |

* cited by examiner

WIDE-BAND MODULATION PLL, TIMING ERROR CORRECTION SYSTEM OF WIDE-BAND MODULATION PLL, MODULATION TIMING ERROR CORRECTION METHOD AND METHOD FOR ADJUSTING RADIO COMMUNICATION APPARATUS HAVING WIDE-BAND MODULATION PLL

TECHNICAL FIELD

The present invention relates to a broadband modulation PLL, a timing error correcting system for broadband modulation PLL, a timing correcting method and a method of adjusting a radio communication device having broadband modulation PLL.

BACKGROUND ART

Low cost, low power consumption, excellent noise characteristics and modulation precision are generally required to PLL modulation. When modulation is carried out by PLL, it is more desirable that the width of the frequency band of PLL (PLL band) is set to be larger than the width of the frequency band of modulated signals (modulation band) to enhance the modulation precision.

However, if the PLL bandwidth is increased, it would cause degradation of noise characteristics. Therefore, there has been proposed a technique called as two-point modulation in which the PLL bandwidth is set to be narrower than the modulation bandwidth, and modulation within the PLL band and modulation out of the PLL band are applied at two different places (for example, see Patent Document 1).

FIG. 10 is a schematic diagram showing a conventional broadband modulation PLL. As shown in FIG. 10, the conventional broadband modulation PLL is equipped with PLL containing a voltage controlled oscillator (hereinafter referred to as VCO) 1 whose oscillation frequency is varied in accordance with a voltage input to a control voltage terminal, a frequency-divider 2 for dividing the frequency of an RF modulation signal output from VCO1, a phase comparator 3 for comparing the phase of an output signal of the frequency-divider 2 and the phase of a reference signal and outputting the signal corresponding to the phase difference and a loop filter 4 for averaging the output signal of the phase comparator, a modulation sensitivity table 7 for outputting a modulation signal on the basis of modulation data, a D/A converter 10 for converting the output signal of the modulation sensitivity table 7 to an analog voltage while adjusting a gain in accordance with a gain control signal from a controller 6, a delta sigma modulator 9 for applying delta sigma modulation to a signal achieved by adding the output signal of the modulation sensitivity table 7 and channel selecting information and outputting the addition result as a frequency-dividing ratio to the frequency-divider 2, and an A/D converter 11 for converting the input voltage value to a control terminal Vt to a digital value and outputting the digital value thus converted to an A/D converter 11.

It is generally needed in the two-point modulation that the timing is coincident between two points, and if any timing difference occurs between the two points, modulation precision such as EVM (Error Vector Magnitude) or the like is degraded. Under the state that there is no timing difference between the two points, EVM is equal to zero. If the difference (the time lag between two points) is larger, EVM is increased (degraded).

However, with respect to the conventional frequency synthesizer described above, there is no description concerning a specific method as to how to perform this timing adjustment, and thus it is difficult to set a proper timing.

(Patent Document 1) Specification of U.S. Pat. No. 6,211,747

The present invention has been implemented in view of the foregoing situation, and has an object to provide a broadband modulation PLL having enhanced modulation precision, a timing error correcting system for the broadband modulation PLL, a timing error correcting method and a method of adjusting a radio communication device having the broadband modulation PLL.

DISCLOSURE OF THE INVENTION

A broadband modulation PLL according to the present invention is equipped with a PLL portion containing a voltage controlled oscillator, a frequency divider for dividing the frequency of an output signal of the voltage controlled oscillator, a phase comparator for comparing the output of the frequency divider with a reference signal and a loop filter for averaging the output of the phase comparator, a first modulation input portion for inputting a first modulation signal to a first position of the PLL portion on the basis of input modulation data, and a second modulation input portion for inputting a second modulation signal to a second position different from the first position of the PLL portion on the basis of the modulation data. The first modulation signal input to the first position of the PLL portion is added with the second modulation signal at the second position, and any one of the first and second modulation input portions inverts the phase of the modulation data and inputs the modulation signal to the PLL potion at the time of a modulation timing adjustment to adjust the modulation timing of the first modulation signal and the second modulation signal.

Furthermore, in the broadband modulation PLL of the present invention, any one of the first modulating portion and the second modulating portion has an inverter for inverting the phase of the modulation data.

Still furthermore, in the broadband modulation PLL of the present invention, at least one of the first modulating portion and the second modulating portion has a delay circuit for adjusting the output timing of the modulation signal.

Still furthermore, in the broadband modulation PLL of the present invention, the first modulation input portion generates a frequency-dividing ratio of the frequency divider as the first modulation signal and outputs the first modulation signal to the frequency divider, and the second modulation input portion outputs the second modulation signal to the input side of the voltage controlled oscillator.

Still furthermore, the broadband modulation PLL of the present invention is further equipped with a timing controller for generating a modulation timing control signal to adjust the modulation timing of the first modulation signal and the second modulation signal.

Still furthermore, in the broadband modulation PLL of the present invention, the timing controller generates the modulation timing control signal on the basis of the input signal of the voltage controlled oscillator.

Still furthermore, in the broadband modulation PLL of the present invention, the timing controller generates the modulation timing control signal on the basis of the output signal of the voltage controlled oscillator.

The broadband modulation PLL of the present invention is further equipped with a measuring unit for demodulating the output signal of the PLL portion and calculating an amplitude value, an operator for calculating a timing error on the basis of the amplitude value calculated by the measuring unit, and a storage unit for storing a timing set value for controlling the timing of at least one of the first modulation input portion and the second modulation input portion which is calculated on the basis of the timing error. The first modulation input portion and the second modulation input portion control the modulation timing on the basis of the set value set in the storage portion.

With the above construction, signals which are opposite to each other in phase are input to different two points in PLL to detect a timing error, and the timing is set so that the error is corrected, whereby the modulation precision can be enhanced.

Furthermore, the presents invention provides a modulation system having the broadband modulation PLL described above.

With this construction, a modulation system having enhanced modulation precision can be provided.

Still furthermore, the present invention provides a radio communication device having the broadband modulation PLL.

With this construction, a radio communication device having enhanced modulation precision can be provided.

A timing correcting system of the broadband modulation PLL according to the present invention is equipped with the broadband modulation PLL described above and a measuring portion for demodulating an output signal of the broadband modulation PLL and calculating an amplitude value, and the broadband modulation PLL has an operating portion for calculating the timing error between the first modulation signal and the second modulation signal on the basis of the amplitude value calculated by the measuring portion, and a storage portion for storing a timing set value for controlling the modulation timing of at least one of the first modulation input portion and the second modulation input portion which is calculated on the basis of the timing error.

With the above construction, a compact and low-cost broadband modulation PLL having excellent modulation precision can be provided.

Furthermore, a timing correcting system for a broadband modulation PLL according to the present invention is equipped with a broadband modulation PLL, a measuring portion for demodulating an output signal of the broadband modulation PLL and detecting a value indicating modulation precision, and a measuring unit for demodulating an output signal of the PLL portion and calculating an amplitude value, wherein the broadband modulation PLL comprises a PLL portion containing a voltage controlled oscillator, a frequency divider for dividing the frequency of an output signal of the voltage controlled oscillator, a phase comparator for comparing the output of the frequency-divider with a reference signal, and a loop filter for averaging the output of the phase comparator, a firs modulation input portion for inputting a first modulation signal to a first position of the PLL portion, a second modulation input portion for inputting a second modulation signal to a second position different from the first position of the PLL portion on the basis of the modulation data, an operating portion for calculating a timing error on the basis of the amplitude value measured by the measuring unit, and a storage portion for storing a timing set value for controlling the output time of at least one of the first modulation input portion and the second modulation input portion which is calculated on the basis of the timing error, thereby adjusting a modulation timing, the first modulation input portion and the second modulation input portion being controlled so that the timing error is corrected on the basis of the timing set value set in the storage portion.

With the above construction, a compact and low-cost broadband modulation PLL having excellent modulation precision can be provided.

A timing error correcting method of the present invention is a timing error correcting method in broadband modulation PLL, and it comprises a step of inputting to different two points in PLL modulation data which are opposite to each other in phase, a step of adding modulation signals based on the modulation data, a step of detecting the timing error between the respective modulation signals on the basis of the added modulation signals, and a step of correcting an output timing of at least one of the two-point modulations input to the PLL on the basis of the detected timing error.

According to this method, the signals which are opposite in phase to each other are input to different two points in PLL to detect a timing error, and the timing is set so that the error is corrected, whereby the modulation precision can be enhanced.

An adjusting method of a radio communication device according to the present invention is a modulation timing adjusting method of a radio communication device having a broadband modulation PLL for applying modulation to different two points of PLL, and it comprises a step of setting a modulation timing of the broadband modulation PLL, wherein the modulation timing setting step comprises a step of inputting to different two points of PLL modulation data which are opposite in phase to each other, a step of outputting a modulation signal of the broadband modulation PLL on the basis of the modulation data, a step of demodulating the modulation signal of the broadband modulation PLL to achieve an amplitude value, a step of detecting the timing error between the respective modulation signals and setting a timing set value into a storage portion provided to the broadband modulation PLL, and a step of correcting a timing of at least one of the two-point modulations input to the PLL.

According to this method, a compact and low-cost radio communication device having excellent modulation precision can be provided.

An adjusting method of a radio communication device according to the present invention is a method of adjusting a radio communication device having a broadband modulation PLL for applying modulation to different two points of PLL, and it comprises a step of setting a modulation timing of the broadband modulation PLL, wherein the modulation timing setting step comprises a step of inputting modulation data to different two points of PLL, a step of outputting modulation signals of the broadband modulation PLL on the basis of the modulation data, a step of demodulating a modulation signal of the broadband modulation PLL and detecting a value indicating a modulation degree, a step of detecting the timing error between the respective modulation signals on the basis of a value indicating the modulation precision and setting a timing set value into a storage portion provided to the broadband modulation PLL, and a step of correcting a timing of at least one of the two-point modulations input to the PLL.

According to this method, a compact and low-cost radio communication device having excellent modulation precision can be provided.

According to the present invention, there can be provided the broadband modulation PLL having the enhanced modulation precision, the timing error correcting system for the broadband modulation PLL, the timing error correcting method and the adjusting method of the radio communication device having the broadband modulation PLL.

Figure 1:
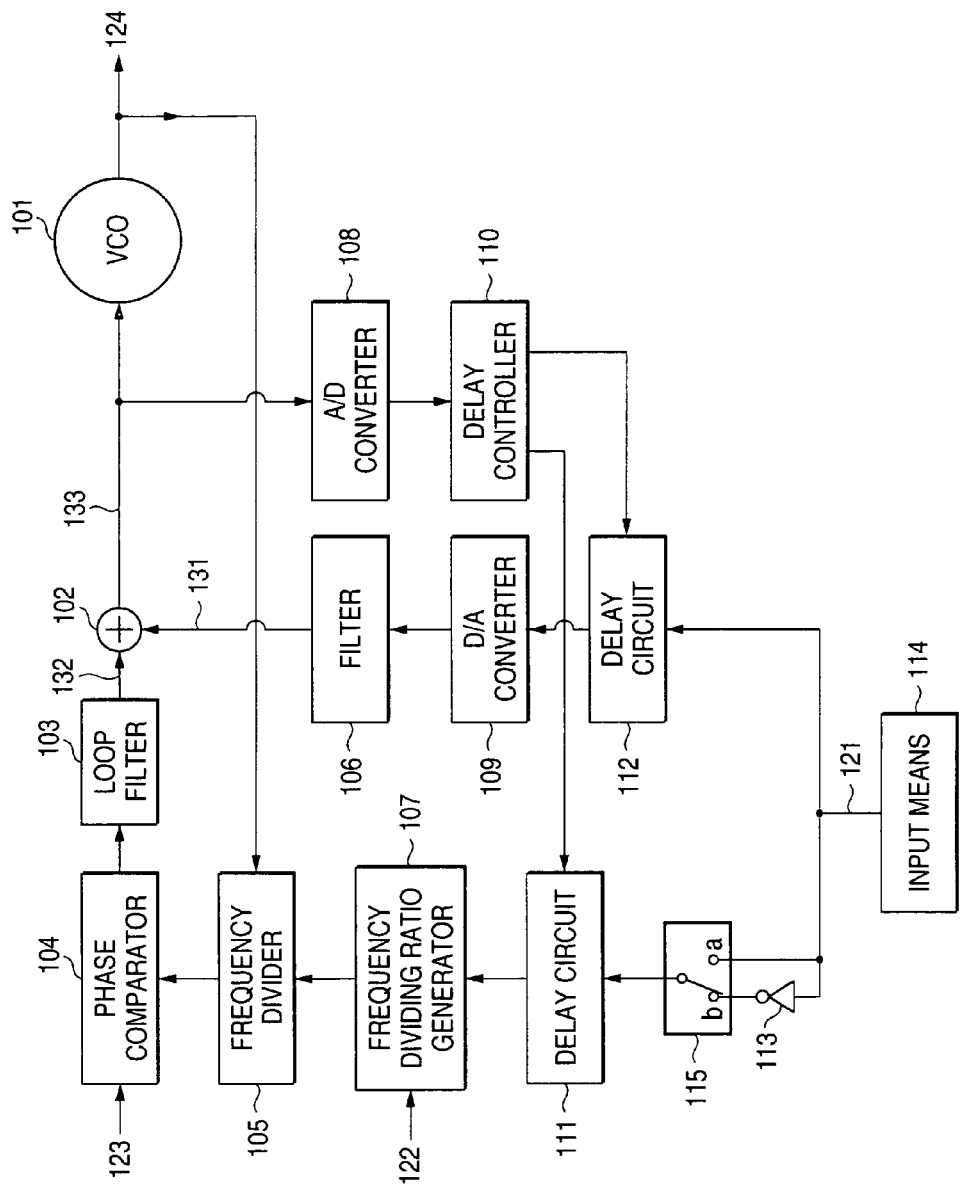
FIG. 1 is a schematic diagram showing a broadband modulation PLL to describe a first embodiment of the present invention.

In the figures, reference numeral 101 represents VCO, 102 represents a frequency divider, 103 represents a phase comparator, 104 represents a loop filter, 105 represents an adder, 106 represents a filter, 107 represents a frequency dividing ratio generator, 108 represents an A/D converter, 109 represents a D/A converter, 110 represents a delay controller, 111, 112 represents a delay circuit, 113 represents an inverter, 114 represents input means, 115 represents a switch, 701 represents a demodulator, 801, 901 represents a measuring unit, 802, 902 represents CPU, 803, 903 represents a memory, 811, 911 represents a demodulator, 812 represents a calculator, and 912 represents a detector.

BEST MODES FOR CARRYING THE INVENTION

First Embodiment

FIG. 1 is a schematic diagram showing a broadband modulation PLL to describe a first embodiment of the present invention. As shown in FIG. 1, the broadband modulation PLL according to the first embodiment is equipped with PLL having a voltage controlled oscillator (hereinafter referred to as VCO) 101 whose oscillation frequency is varied in accordance with a voltage input to a control voltage terminal, a frequency divider 105 for dividing the frequency of an RF modulation signal 124 output from VCO 101, a phase comparator 104 for comparing the phase of an output signal of the frequency divider 105 with the phase of a reference signal 123 and outputting the signal corresponding to the phase difference, and a loop filter 103 for averaging the output signal of the phase comparator 104.

The broadband modulation PLL of the first embodiment is further equipped with input means 114 for inputting phase modulation data 121, an inverter 113 for inverting the phase of the phase modulation data 121 input from the input means 114, a delay circuit 111 for controlling the output time of the phase modulation data 121 or the output of the inverter (inverted phase modulation data), a switch 115 for connecting any one of the output of the inverter 113 and the phase modulation data 121 to the delay circuit 111, and a frequency dividing ratio generator 107 for outputting a frequency dividing ratio to the frequency divider 105 on the basis of the output of the delay circuit 111 and carrier frequency data 122.

Furthermore, the broadband modulation PLL of the first embodiment is further equipped with a delay circuit 112 which is another input destination of the input means 114 and controls the output time of the phase modulation data 121, a D/A converter 109 for converting the output of the delay circuit 112 to an analog signal, a filter 106 for removing high frequency components from the output of the D/A converter 109, an adder 102 for adding the output of the loop filter 103 and the output of the filter 106, an A/D converter 108 for converting the analog output of the adder 102 to a digital signal, and a delay controller 110 for controlling the two delay circuits 111 and 112.

Next, the normal modulation operation of the broadband modulation PLL of this embodiment will be described. Under the normal operation, the switch 115 is switched to select a terminal a, and the phase modulation data 121 is input to the delay unit 111. In the delay unit 111, a predetermined output time adjustment is carried out, a frequency dividing ratio to the frequency divider 105 is generated in the frequency dividing ratio generator and modulation is applied to PLL. It is preferable that this modulation is within the PLL band.

Furthermore, the phase modulation data 121 from the input means 114 is also input to the delay circuit 112. The delay circuit 112 carries out a predetermined time adjustment on the phase modulation data 121 thus input, and outputs it through the D/A converter 109 and the filter 106 to the adder 102, whereby modulation can be applied to the input signal of VCO 101. It is preferable that this modulation is out of the PLL band.

As described above, the frequency dividing ratio of the frequency divider 105 and the control voltage of VCO 101 are controlled and the modulation is applied, that is, the modulation is applied at two points, whereby broadband modulation can be performed.

Next, the timing error correcting operation of the broadband modulation PLL of this embodiment will be described.

Under the timing error correcting operation, the switch 115 is switched so as to select a terminal b, and the phase modulation data 121 is input through the inverter 113 to the delay circuit 111. Accordingly, the phase of the phase modulation data input to the delay circuit 111 is opposite in phase to the phase modulation data 121. The phase modulation data 121 is output through the inverter 113, the delay circuit 111, the frequency dividing ratio generator 107, the frequency divider 105 and the phase comparator 104 as the output signal 132 from the loop filter 103.

The phase modulation data 121 is also input to the delay circuit 112, and output through the D/A converter 109 as the output signal 131 of the filter 106. The adder 102 adds the output signal 131 of the filter 106 with the output signal 132 of the loop filter 103, and outputs the output signal 133 of the adder 102.

The A/D converter 108 converts the output signal 133 of the adder to a digital signal, and inputs it to the delay controller 110. The delay controller 110 controls the delay circuit 111 and the delay circuit 112 on the basis of the digitally-converted output signal 133 of the adder 102 so that the output signal 131 and the output signal 132 are coincident with each other in timing as much as possible.

Figure 2:
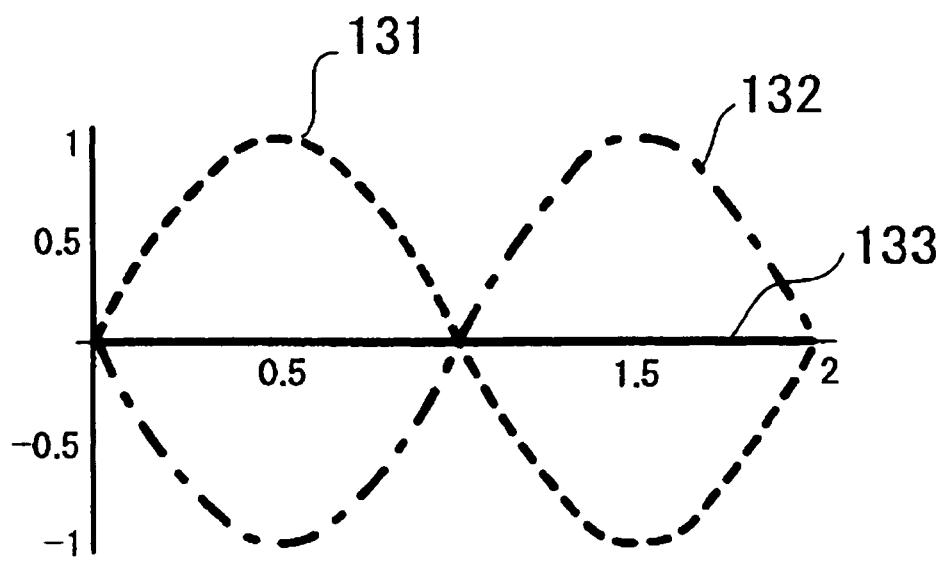
FIG. 2 is a diagram showing waveforms of an output signal 131 of a filter 106, an output signal 132 of a loop filter 103 and an output signal 133 of an adder 102.
Figure 3:
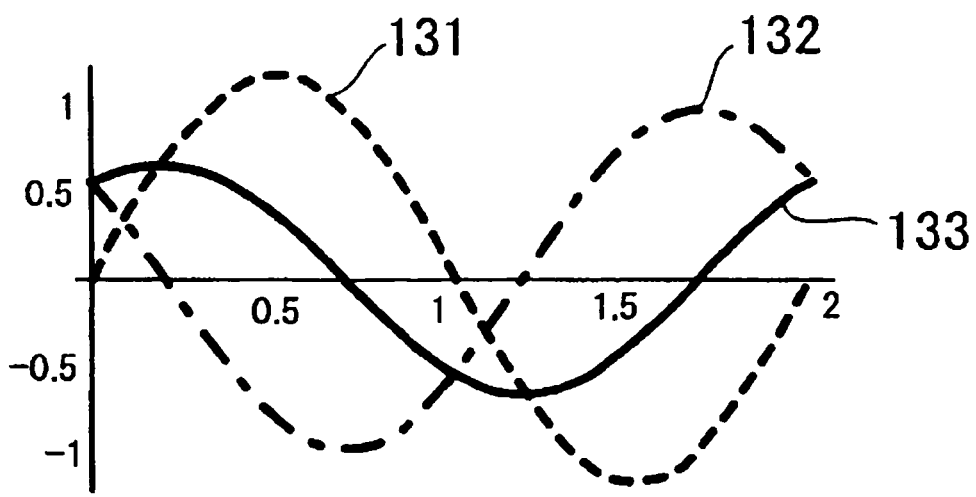
FIG. 3 is a diagram showing waveforms of the output signal 131 of the filter 106, the output signal 132 of the loop filter 103 and the output signal 133 of the adder 102.

Next, an example of the timing error detecting/correcting method will be described. FIGS. 2 and 3 are diagrams showing the waveforms of an output signal 131 of the filter 106, an output signal 132 of the loop filter 103 and an output signal 133 of the adder 102.

First, the phase modulation data from the input means 121 is set to a sine wave. The inverter 113 is connected to the front stage of the delay circuit 112, and thus the phase of the signal input to the delay circuit 111 is opposite to the phase of the signal input to the delay circuit 112. That is, the output signal 131 output through the delay circuit 112, the D/A converter 109 and the filter 106 is opposite in phase to the output signal 132 output through the delay circuit 111, the frequency dividing ratio generator 107, the frequency divider 105, the phase comparator 104 and the loop filter 103. Accordingly, when the output signal 131 and the output signal 132 are coincident with each other in timing, the signal added in the adder 102 is equal to zero as shown in FIG. 2.

However, when the output signal 131 and the output signal 132 are displaced from each other in timing due to dispersion of the loop filter 103 or the like, the output signal 133 of the adder exhibits the characteristic of a sine wave as shown in FIG. 3. The amplitude of the output signal 133 is more greatly increased as the timing error between the output signal 131 and the output signal 132 is larger. Accordingly, by detecting the output signal 133 of the adder 102, the timing error between the output signal 131 and the output signal 132 can be detected. The A/D converter 10B converts this output signal 133 to a digital signal, and the delay controller 110 calculate amplitude information from the digital signal output from the A/D converter 108 and outputs a control signal to the delay circuit 111 and the delay circuit 112 on the basis of the above calculation result. The delay controller 110 generates this control signal so that the amplitude of the output signal 133 of the adder 102 is reduced, whereby the timing error in the two-point modulation can be corrected.

Figure 4:
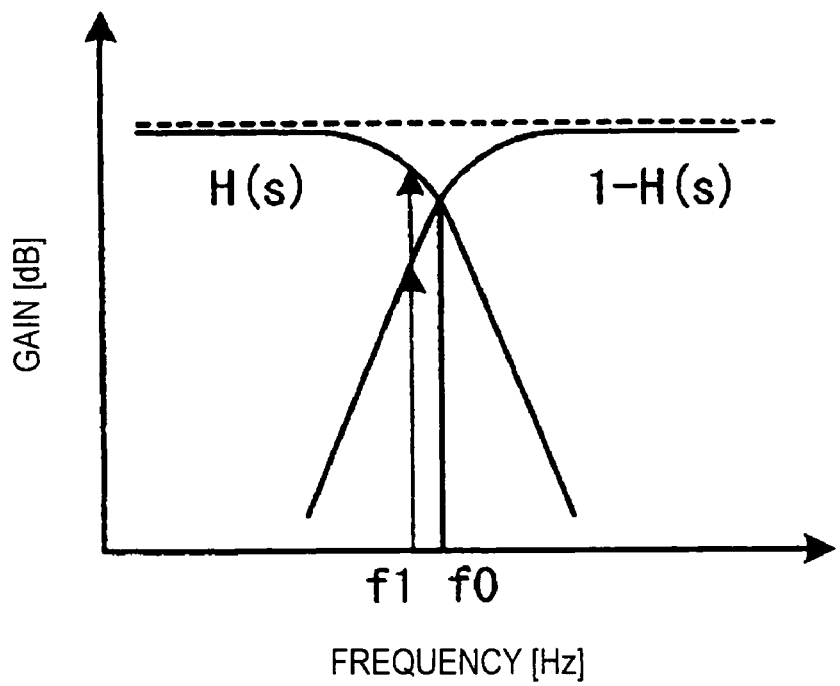
FIG. 4 is a diagram showing a transfer function of PLL.

Here, FIG. 4 is a diagram showing a transfer function of PLL. a modulation signal applied to the frequency divider 105 is subjected to a low-pass filter as shown by a transfer function H(s) of FIG. 4. Furthermore, the modulation signal applied to VCO 101 is subjected to a high-pass filter as shown by a transfer function 1−H(s).

If the sine wave at the frequency f0 when the transfer functions H8s) and 1−H(s) cross each other can be selected as the input phase modulation data 121, the value of the output signal 133 could be set to 0 as shown in FIG. 2 when the two-point modulation timings are coincident with each other. However, it is difficult to select the frequency f0 due to dispersion of the loop filter 103 or the like, and a sine wave at a frequency displaced from the frequency f0 is actually input as indicated by a frequency f1 shown in FIG. 4.

Figure 5:
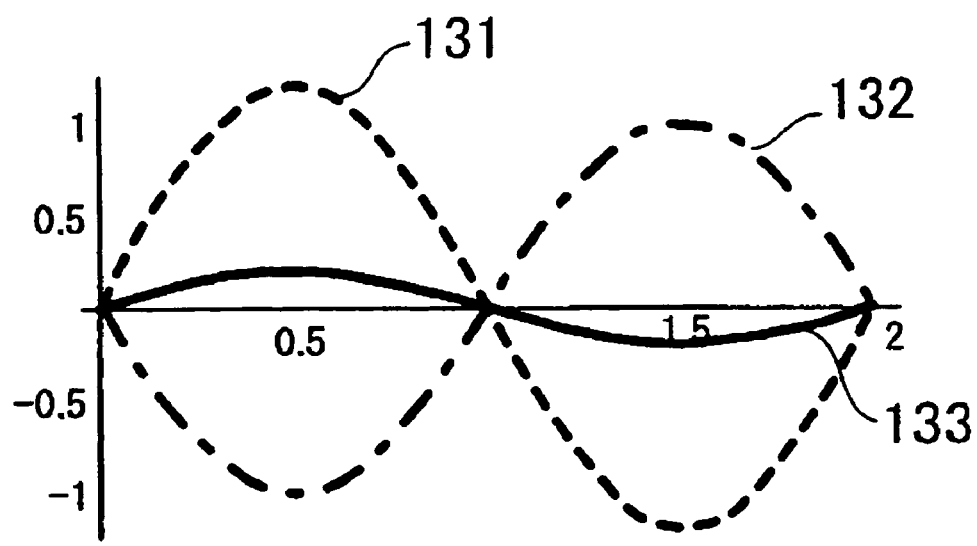
FIG. 5 is a diagram showing waveforms of the output signal 131 of the filter 106, the output signal 132 of the loop filter 103 and the output signal 133 of the adder 102.
Figure 6:
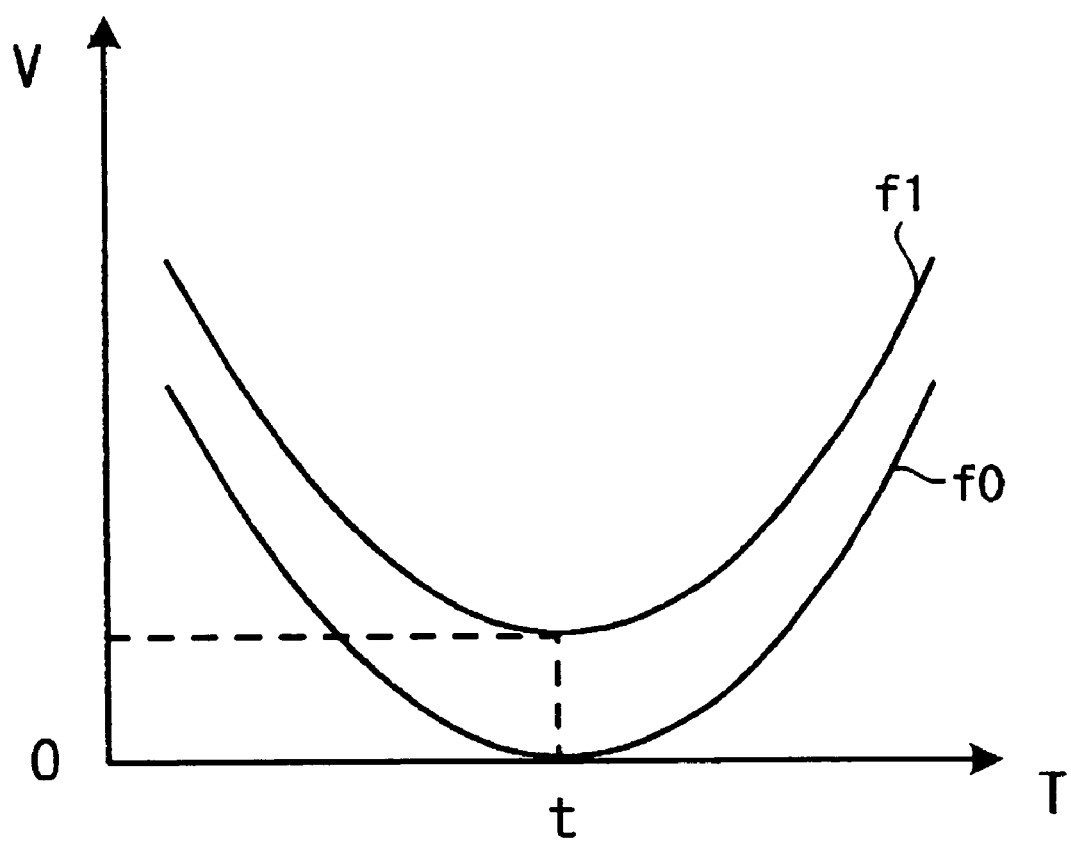
FIG. 6 is a diagram showing a time t when the voltage V of the output signal 133 at frequencies f0 and f1 is minimum.

Accordingly, some difference occurs between the gains to the respective modulation inputs, and thus the amplitude of the output signal 133 is not equal to zero as shown in FIG. 5 even when the output signal 131 and the output signal 132 are coincident in timing with each other. However, even in such a case, the amplitude of the output signal 133 is increased more greatly as the output signal 131 and the output signal 132 are displaced in timing from each other as described above. Accordingly, the delay correcting portion 110 can correct the timing error by determining the time t at which the voltage V of the output signal 133 is minimum and generating the control signals to the delay circuits 111 and 112 as shown in FIG. 6.

The phase modulation data input at the timing error detection time is not limited to the sine wave, and any waveform may be used. It is more preferable that the phase modulation data is phase modulation data in a narrow band. Furthermore, the delay circuit is provided to both the side at which the modulation is applied to the frequency divider 105 and the side at which the modulation is applied to VCO 101, however, the delay circuit may be provided to only one of them. In this case, the timing at the side at which no delay circuit is provided is fixed, and thus the timing error can be corrected by controlling the timing at the side at which the delay circuit is provided. Furthermore, the inverter 113 may be provided to the side at which modulation is applied to VCO 101 in place of the provision thereof to the side at which the modulation is applied to the frequency divider 105.

According to the broadband modulation PLL of the first embodiment, the signals which are opposite to each other in phase are supplied to the different points in PLL to detect a timing error therebetween, and the timing is set so as to correct this error, thereby enhancing the modulation precision. Furthermore, the broadband modulation PLL as described above is applicable to a modulation system, a radio communication device such as a portable communication terminal, a radio base station or the like, etc., and a modulation system, a radio communication device, etc. in which the modulation precision is enhanced can be provided.

Second Embodiment

Figure 7:
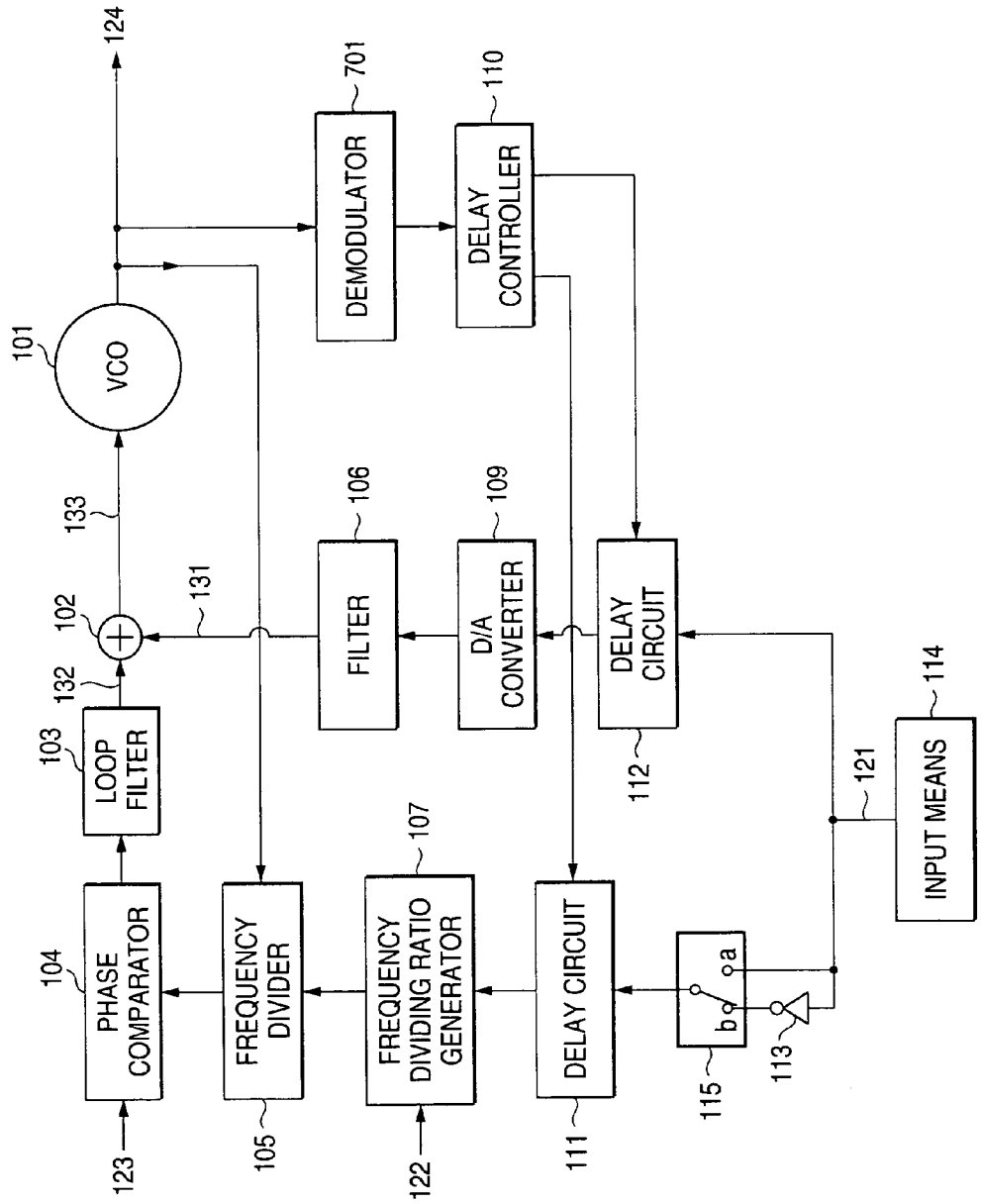
FIG. 7 is a schematic diagram showing broadband modulation PLL to described a second embodiment of the present invention.

FIG. 7 is a schematic diagram showing a broadband modulation PLL to described a second embodiment of the present invention. In FIG. 7, duplicative parts as described with respect to the first embodiment are represented by the same reference numerals.

As shown in FIG. 7, the broadband modulation PLL of the second embodiment is equipped with a demodulator 701 for demodulating an RF modulation signal 124, and the delay controller 110 detects a timing error on the basis of the output of the demodulator 701, and outputs control signals to the control circuits 111 and 112 to correct the timing error.

According to the broadband modulation PLL of the second embodiment as described above, signals which are opposite to each other in phase are input to different two points in PLL to detect a timing error, and the timing is set so that the error is corrected, thereby enhancing the modulation precision. Furthermore, the broadband modulation PLL as described above is applicable to a modulation system such as a polar modulation system or the like, a radio communication device such as a portable communication terminal, a radio base station or the like, etc., and a modulation system, a radio communication device, etc. in which the modulation precision is enhanced can be provided.

Furthermore, when the broadband PLL of this embodiment is applied to a radio communication device, if the construction other than the demodulator 70 is equipped to the transmission system of the radio communication device and the demodulator 701 is commonly used as the demodulator equipped to the reception system, the A/D converter for error detection is not required to the transmission system, so that the circuit scale of the radio communication device can be reduced and the compact and low-cost radio communication device having excellent modulation precision can be provided.

Third Embodiment

Figure 8:
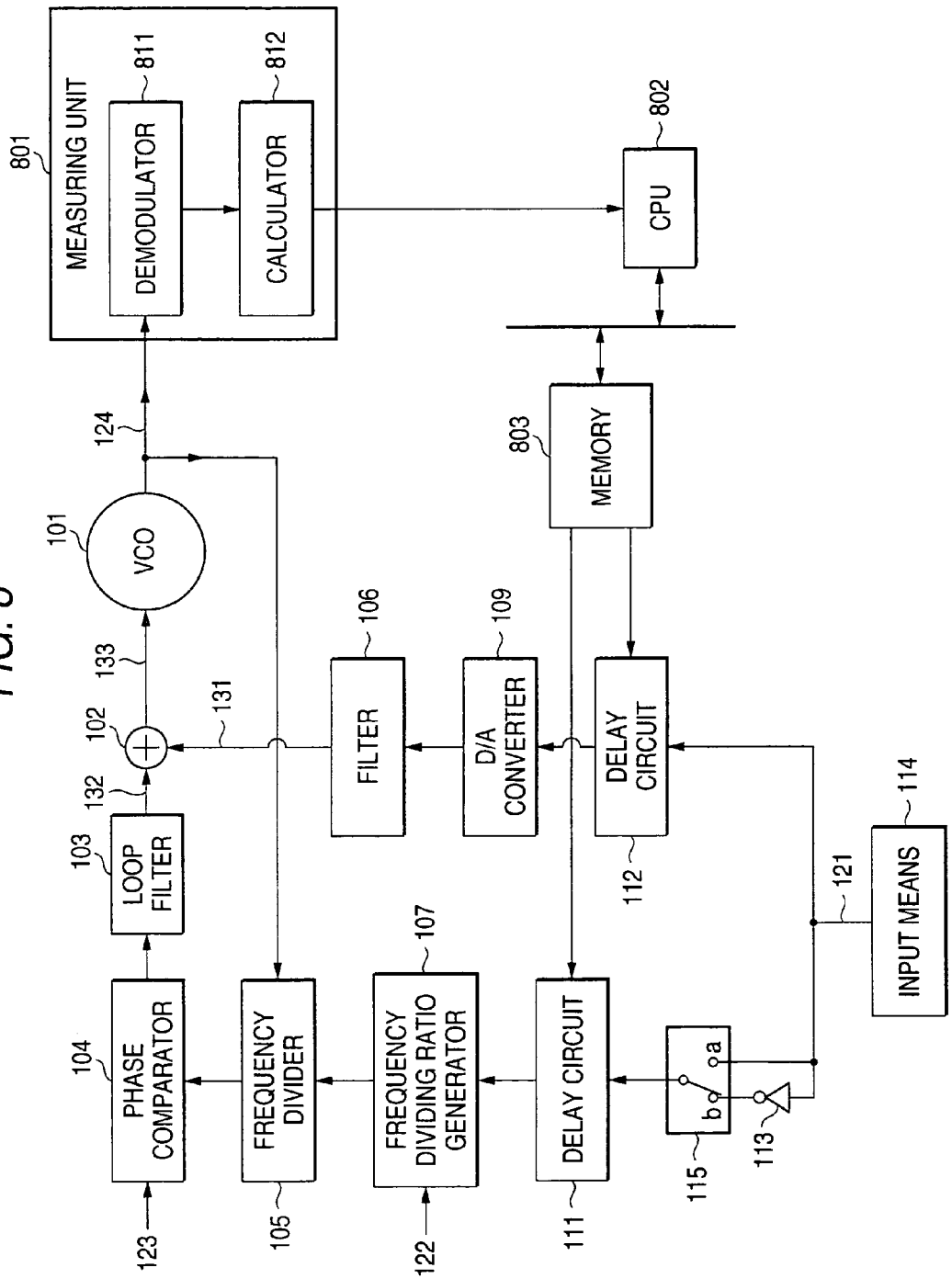
FIG. 8 is a schematic diagram showing broadband modulation PLL to describe a third embodiment of the present invention.

FIG. 8 is a schematic diagram showing a broadband modulation PLL to describe a third embodiment of the present invention. In FIG. 8, duplicative parts as described with respect to the first embodiment are represented by the same reference numerals.

As shown in FIG. 8, the broadband modulation PLL of the third embodiment is equipped with a measuring unit 801 having a demodulator 811 for demodulating an RF modulation signal 124 and a calculator 812 for calculating an amplitude value, CPU 802 for setting the set values of the delay circuits 111 and 112 on the basis of the amplitude value detected by the measuring unit by using software, and a memory 803. The output times of the delay circuits 111 and 112 are controlled on the basis of the set values thus set, and the timing error is corrected.

According to the broadband modulation PLL of the third embodiment as described above, signals which are opposite to each other in phase are input to different two points in PLL to detect a timing error, and the timing is set so as to correct the error, thereby enhancing the modulation precision. Furthermore, the broadband modulation PLL as described above is applicable to a modulation system such as a polar modulation system or the like, a radio communication device such as a portable communication terminal, a radio base station or the like, etc., and a modulation system, a radio communication device, etc. in which the modulation precision is enhanced can be provided.

Furthermore, the measuring unit 801 is connected to the broadband PLL to measure the amplitude value only when the measuring unit 801 is provided at the outside, that is, when the broadband modulation PLL is manufactured or when the timing of a radio communication device such as a mobile radio transceiver, a radio base station or the like which has the broadband modulation PLL is adjusted, whereby it is unnecessary to provide the delay control circuit in the broadband modulation PLL. Therefore, the circuit scale of the broadband modulation PLL is reduced, and the compact, low-cost and excellent modulation-precision broadband modulation PLL, the radio communication device, etc. and the adjusting method can be provided.

Fourth Embodiment

Figure 9:
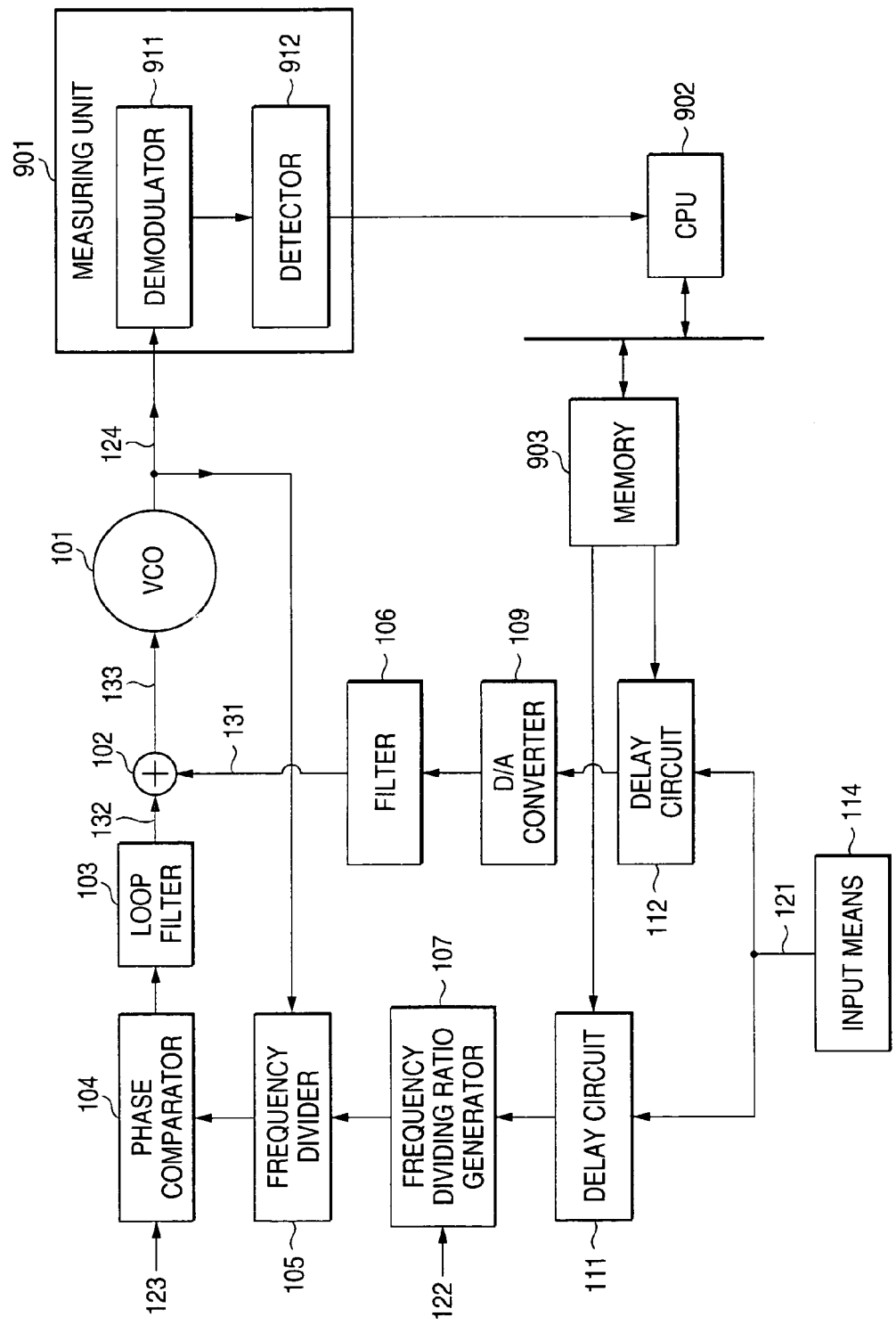
FIG. 9 is a schematic diagram showing broadband modulation PLL to described a fourth embodiment of the present invention.
Figure 10:
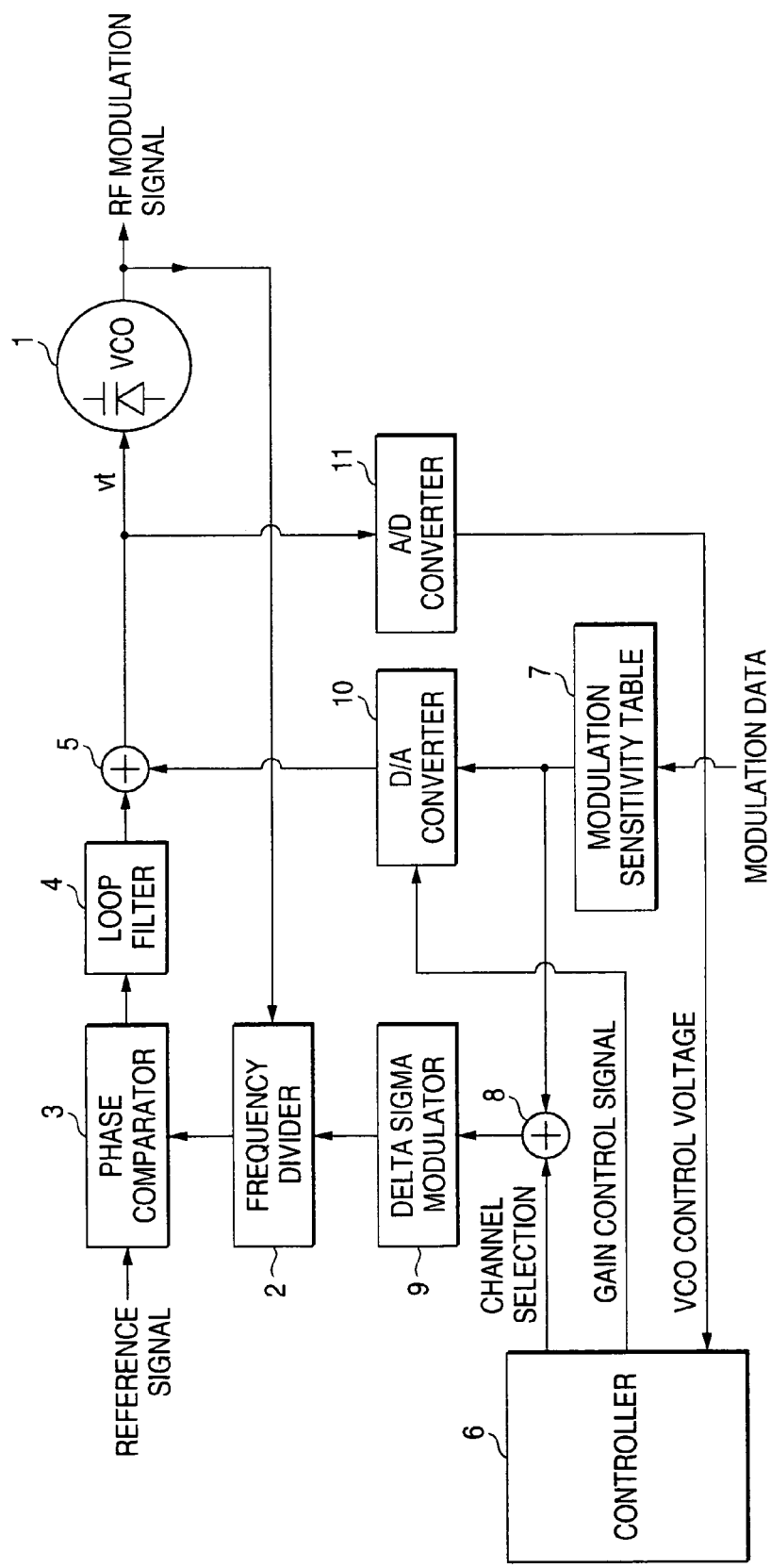
FIG. 10 is a schematic diagram showing conventional broadband modulation PLL.

FIG. 9 is a schematic diagram showing a broadband modulation PLL to describe a fourth embodiment of the present invention. In FIG. 9, duplicative parts as described with reference to the third embodiment of FIG. 8 are represented by the same reference numerals.

As shown in FIG. 9, the broadband modulation PLL of the fourth embodiment is equipped with a measuring unit 901 having a demodulator 911 for demodulating an RF modulation signal 124, and a detector 912 for detecting a value indicating modulation precision such as EVM, phase error or the like, and also has a CPU 902 for setting set values of the delay circuits 111 and 112 on the basis of the value indicating the modulation precision detected by the measuring unit 901 by using software, and a memory 903. The output times of the delay circuits 111 and 112 are controlled on the basis of the set values set in the memory 903.

According to the broadband modulation PLL of the fourth embodiment as described above, by detecting the timing error and setting the timing so as to correct the error, the modulation precision can be enhanced. Furthermore, the broadband modulation PLL is applicable to a modulation system such as a polar modulation system or the like, a radio communication device such as a portable communication terminal, a radio base station or the like, etc., and a modulation system, a radio communication device, etc. in which the modulation precision is enhanced can be provided.

Furthermore, the measuring unit 901 is connected to the broadband PLL to directly calculate the value indicating the modulation precision only when the measuring unit 901 is provided at the outside, that is, the broadband modulation PLL is manufactured or when the timing of a radio communication device such as a mobile radio transceiver, a radio base station or the like which has the broadband modulation PLL described above is adjusted, whereby it is unnecessary to provide the delay control circuit and the inverter in the broadband modulation PLL. Therefore, the circuit scale of the broadband modulation PLL is reduced, and the compact, low-cost and excellent modulation-precision broadband modulation PLL, radio communication device, etc. and the adjusting method can be provided.

The present invention has been described in detail or by referring to the specific embodiments, however, it is apparent from persons skilled in the art that various alterations or modifications are made without departing from the spirit and subject matter of the present invention.

The present invention is based on Japanese Patent Application No. 2003-298856 filed on Aug. 22, 2003, and the content thereof is taken as a reference in this application.

INDUSTRIAL APPLICABILITY

The broadband modulation PLL and the timing error correcting method according to the present invention has an effect of enhancing the modulation precision by detecting the timing error and controlling the timing, and it is useful for a modulation system, a radio communication device such as a portable communication terminal, a radio base station or the like, etc.

The invention claimed is:

1. A broadband modulation PLL comprising:
a PLL portion containing a voltage controlled oscillator, a frequency divider for dividing the frequency of an output signal of the voltage controlled oscillator, a phase comparator for comparing the output of the frequency divider with a reference signal, and a loop filter for averaging the output of the phase comparator;
a first modulation input portion for inputting a first modulation signal to a first position of the PLL portion on the basis of input modulation data; and
a second modulation input portion for inputting a second modulation signal to a second position different from the first position of the PLL portion on the basis of the modulation data, wherein the first modulation signal input to the first position of the PLL portion is added with the second modulation signal at the second position, and any one of the first and second modulation input portions inverts the phase of the modulation data and inputs the modulation signal to the PLL portion at the time of a modulation timing adjustment to adjust the modulation timing of the first modulation signal and the second modulation signal.

2. The broadband modulation PLL according to claim 1, wherein any one of the first modulating portion and the second modulating portion has an inverter for inverting the phase of the modulation data.

3. The broadband modulation PLL according to claim 1, wherein at least one of the first modulating portion and the second modulating portion has a delay circuit for adjusting the output timing of the modulation signal.

4. The broadband modulation PLL according to claim 1, wherein the first modulation input portion generates a frequency-dividing ratio of the frequency divider as the first modulation signal and outputs the first modulation signal to the frequency divider, and the second modulation input portion outputs the second modulation signal to the input side of the voltage controlled oscillator.

5. The broadband modulation PLL according to claim 1, further comprising a timing controller for generating a modulation timing control signal to adjust the modulation timing of the first modulation signal and the second modulation signal.

6. The broadband modulation PLL according to claim 5, wherein the timing controller generates the modulation timing control signal on the basis of the input signal of the voltage controlled oscillator.

7. The broadband modulation PLL according to claim 5, wherein the timing controller generates the modulation timing control signal on the basis of the output signal of the voltage controlled oscillator.

8. The broadband modulation PLL according to claim 5, further comprising:
   a measuring unit for demodulating the output signal of the PLL portion and calculating an amplitude value;
   an operator for calculating a timing error on the basis of the amplitude value calculated by the measuring unit; and
   a storage unit for storing a timing set value for controlling the timing of at least one of the first modulation input portion and the second modulation input portion which is calculated on the basis of the timing error, wherein the first modulation input portion and the second modulation input portion control the modulation timing on the basis of the set value set in the storage portion.

9. A modulation system having the broadband modulation PLL according to claim 1.

10. A radio communication device having the broadband modulation PLL according to claim 1.

11. A timing correcting system for a broadband modulation PLL, comprising:
   the broadband modulation PLL according to claim 1; and
   a measuring portion for demodulating an output signal of the broadband modulation PLL and calculating an amplitude value, wherein the broadband modulation PLL has an operating portion for calculating the timing error between the first modulation signal and the second modulation signal on the basis of the amplitude value calculated by the measuring portion, and a storage portion for storing a timing set value for controlling the modulation timing of at least one of the first modulation input portion and the second modulation input portion which is calculated on the basis of the timing error.

12. A timing correcting system for a broadband modulation PLL, comprising:
   a broadband modulation PLL;
   a measuring portion for demodulating an output signal of the broadband modulation PLL and detecting a value indicating modulation precision; and
   a measuring unit for demodulating an output signal of the PLL portion and calculating an amplitude value, wherein the broadband modulation PLL comprises a PLL portion containing a voltage controlled oscillator, a frequency divider for dividing the frequency of an output signal of the voltage controlled oscillator, a phase comparator for comparing the output of the frequency-divider with a reference signal, and a loop filter for averaging the output of the phase comparator, a first modulation input portion for inputting a first modulation signal to a first position of the PLL portion, a second modulation input portion for inputting a second modulation signal to a second position different from the first position of the PLL portion on the basis of the modulation data, an operating portion for calculating a timing error on the basis of the amplitude value measured by the measuring unit, and a storage portion for storing a timing set value for controlling the output time of at least one of the first modulation input portion and the second modulation input portion which is calculated on the basis of the timing error, thereby adjusting a modulation timing, the first modulation input portion and the second modulation input portion being controlled so that the timing error is corrected on the basis of the timing set value set in the storage portion.

13. A timing error correcting method in broadband modulation PLL comprising:
   a step of inputting to different two points in PLL modulation data which are opposite to each other in phase;
   a step of adding modulation signals based on the modulation data;
   a step of detecting the timing error between the respective modulation signals on the basis of the added modulation signals; and
   a step of correcting an output timing of at least one of the two-point modulations input to the PLL on the basis of the detected timing error.

14. An adjusting method of a radio communication device having a broadband modulation PLL for applying modulation to different two points of PLL, comprising:
   a step of setting a modulation timing of the broadband modulation PLL, wherein the modulation timing setting step comprises a step of inputting to different two points of PLL modulation data which are opposite in phase to each other, a step of outputting a modulation signal of the broadband modulation PLL on the basis of the modulation data, a step of demodulating the modulation signal of the broadband modulation PLL to achieve an amplitude value, a step of detecting the timing error between the respective modulation signals and setting a timing set value into a storage portion provided to the broadband modulation PLL, and a step of correcting a timing of at least one of the two-point modulations input to the PLL.

15. An adjusting method of a radio communication device having a broadband modulation PLL for applying modulation to different two points of PLL, comprising:
   a step of setting a modulation timing of the broadband modulation PLL, wherein the modulation timing setting step comprises a step of inputting modulation data to different two points of PLL, a step of outputting modulation signals of the broadband modulation PLL on the basis of the modulation data, a step of demodulating a modulation signal of the broadband modulation PLL and detecting a value indicating a modulation degree, a step of detecting the timing error between the respective modulation signals on the basis of a value indicating the modulation precision and setting a timing set value into a storage portion provided to the broadband modulation PLL, and a step of correcting a timing of at least one of the two-point modulations input to the PLL.

16. The broadband modulation PLL according to claim 1, wherein the first and second modulation input portions input the modulation data and input, respectively, the first modulation signal and the second modulation signal to the PLL portion under a normal operation; and any one of the first and second modulation input portions inverts the phase of the modulation data and inputs the respective modulation signal to the PLL at the time of a modulation timing adjustment.

* * * * *